(12) United States Patent
Baorda et al.

(10) Patent No.: US 11,256,280 B2
(45) Date of Patent: Feb. 22, 2022

(54) VOLTAGE-CURRENT CONVERTER, CORRESPONDING DEVICE AND METHOD

(71) Applicant: STMicroelectronics S.r.l., Agrate Brianza (IT)

(72) Inventors: Roberto Pio Baorda, Casarile (IT); Paolo Angelini, Bologna (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/187,107

(22) Filed: Feb. 26, 2021

(65) Prior Publication Data

US 2021/0271281 A1 Sep. 2, 2021

(30) Foreign Application Priority Data

Feb. 28, 2020 (IT) .................. 102020000004159

(51) Int. Cl.
*G05F 3/26* (2006.01)
*G05F 1/46* (2006.01)
*G05F 1/56* (2006.01)

(52) U.S. Cl.
CPC .............. *G05F 3/262* (2013.01); *G05F 1/461* (2013.01); *G05F 1/561* (2013.01)

(58) Field of Classification Search
None
See application file for complete search history.

(56) References Cited

U.S. PATENT DOCUMENTS

| 4,853,610 A | 8/1989 | Schade, Jr. |
| 6,259,322 B1 | 7/2001 | Muza |
| 6,538,503 B2* | 3/2003 | Burt ............... H03F 3/347 330/257 |
| 9,608,586 B2 | 3/2017 | Du et al. |
| 2013/0234685 A1 | 9/2013 | Thoka |

OTHER PUBLICATIONS

Kumwachara, K., et al., "An accurate CMOS differential voltage-to-current converter", International Journal of Electronics, vol. 77, No. 6, Dec. 1994, 9 pages.

Zhang, T., et al., "A 28uW EEG Readout Front-End Utilizing a Current-Mode Instrumentation Amplifier and a Source-Follower-Based LPF", Microelectronics and Electronics (Primeasia), 2010 Asia Pacific Conference on Postgraduate Research, Sep. 22, 2010, 4 pages.

* cited by examiner

*Primary Examiner* — Jeffery S Zweizig
(74) *Attorney, Agent, or Firm* — Slater Matsil, LLP (57) ABSTRACT

An embodiment voltage-current converter circuit comprises a first amplifier and a second amplifier having homologous first input nodes configured to receive a voltage signal therebetween as well as homologous second input nodes having a resistor coupled therebetween. First and second current mirror circuits are provided comprising first input transistors having their control terminal coupled to the output nodes of the amplifiers. First and second current sensing circuitry having first and second current output nodes are coupled to the current mirror output nodes of the current mirror circuits and configured to provide therebetween a current which is a function of the voltage signal between the homologous first input nodes of the amplifier.

20 Claims, 3 Drawing Sheets

ND METHOD

VOLTAGE-CURRENT CONVERTER, CORRESPONDING DEVICE AND METHOD

CROSS-REFERENCE TO RELATED APPLICATIONS

This application claims the benefit of Italian Application No. 102020000004159, filed on Feb. 28, 2020, which application is hereby incorporated herein by reference.

TECHNICAL FIELD

The description relates to voltage-current (V-I) converters and methods.

One or more embodiments are applicable, for instance, in wireless chargers.

BACKGROUND

Various conventional V-I converters having a high impedance (hi-Z) input in a single-ended structure are known in the art.

These known solutions may exhibit various drawbacks such as low isolation from the substrate, coupling noise and high harmonic distortion.

These drawbacks may become particularly significant, for instance, in sinewave generators clocked with clock frequencies in excess of 100 MHz, where a significant amount of noise can be injected into the substrate, and/or in those applications where a very pure sinusoidal current signal is desirable.

Generating a sinusoidal current tone having a high spurious-free dynamic range (SFDR—that is, the strength ratio of a fundamental signal to the strongest spurious signal in the output) is exemplary of such an application.

Also, certain known V-I converters with a fully differential architecture exhibit an input impedance which may not be compatible with the output stage of an associated sinewave generator in circumstances where obtaining a desired output current dictates an input resistance value of the order of 1 kΩ.

SUMMARY

An object of one or more embodiments is to contribute in providing voltage-current converters which facilitate overcoming the drawbacks outlined in the foregoing.

According to one or more embodiments, that object can be achieved by means of a circuit having the features set forth in the claims that follow.

One or more embodiments may relate to a corresponding device. As discussed in the introductory portion of this description, a wireless charger may be a (non-limiting) example of such a device.

One or more embodiments may relate to a corresponding method.

The claims are an integral part of the technical teaching provided herein in respect of illustrative embodiments.

One or more embodiments may provide a circuit architecture capable of converting a differential sinusoidal voltage into a (very pure) sinusoidal current—for use in driving an antenna, for instance—having a high SFDR, namely without appreciable distortion.

In one or more embodiments, a current Vin/R (that is the ratio of an input voltage to a resistance) may be mirrored by two current mirrors, with the amplitude of the output current selectively changed via selection switches and the current read at a (very) low impedance circuit and the buffered at an output pad. Circuit symmetry along with the virtual identity of components (transistors) and circuits facilitates achieving a (very) low harmonic distortion.

One or more embodiments may provide a (fully) differential structure exhibiting a hi-Z input impedance. Due to the intrinsic symmetry, this may result in a reduced substrate and coupling noise from other high-frequency switching circuits in a same device (in a same application specific integrated circuit or ASIC, for instance), without distortion added. The high input impedance (hi-Z) of one or more embodiments may facilitate a simpler design of the output stage of an associated sinewave generator.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the following description various specific details are given to provide a thorough understanding of various exemplary embodiments of the present specification. The embodiments may be practiced without one or several specific details, or with other methods, components, materials, etc. In other instances, well-known structures, materials, or operations are not shown or described in detail in order to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings/references provided herein are for convenience only, and therefore do not interpret the extent of protection or scope of the embodiments.

Figure 1:
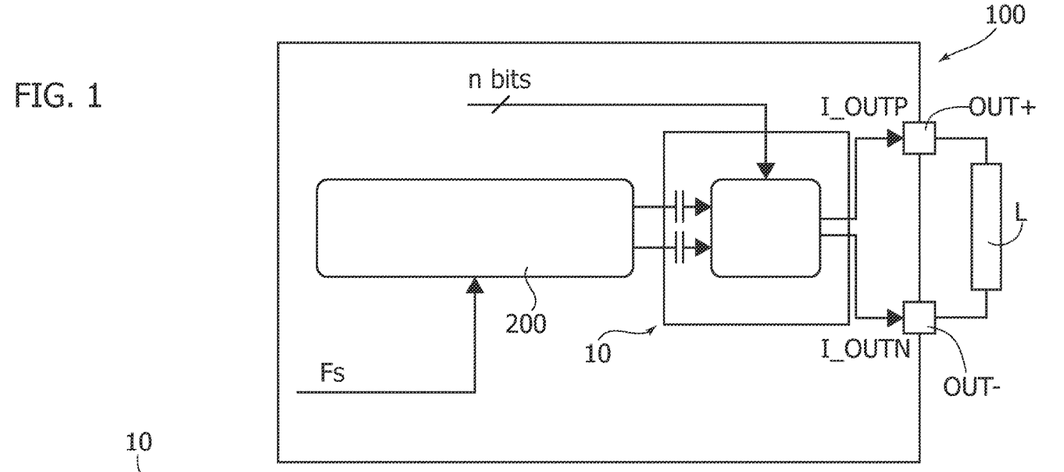
FIG. 1 is a block diagram of a current generator.

FIG. 1 is a block diagram of a current generator designated 100 as whole.

A current generator 100 as illustrated may be used to apply to a load L such as an antenna coil a (differential) sinewave current I_OUTP, I_OUTN flowing between a first output node OUT+ and a second output node OUT−.

To that effect, the generator illustrated in FIG. 1 comprises a sinewave voltage generator 200 (of any type known to those of skill in the art) which produces, for instance, a sinusoidal voltage waveform.

The voltage signal from the sinewave voltage generator 200 is applied to a voltage-current (V-I) converter 10 to produce (possibly with the current signal amplitude controllable as a function of a n-bit digital signal) the sinewave current between the first output node OUT+ and the second output node OUT−.

Of course, the one illustrated in FIG. 1 is just one of a wide variety of possible applications of a V-I converter.

Consequently, one or more embodiments as discussed in the following are not intended to be limited, even indirectly, to such a possible application and/or to the nature and type of the load L.

Figure 2:
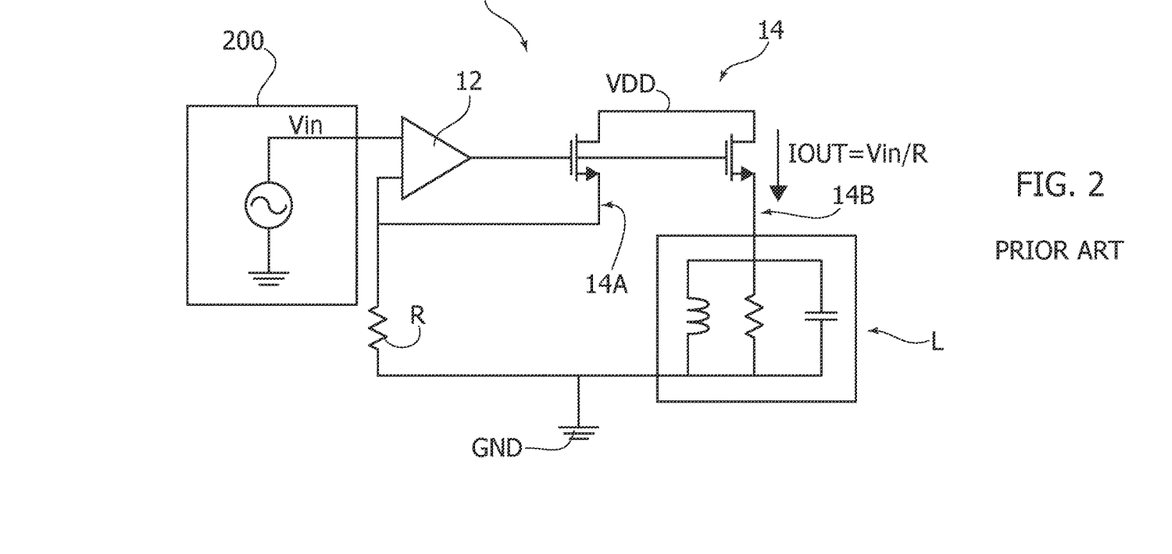
FIG. 2 is a circuit diagram of a conventional single ended voltage-current (V/I) converter.
Figure 3:
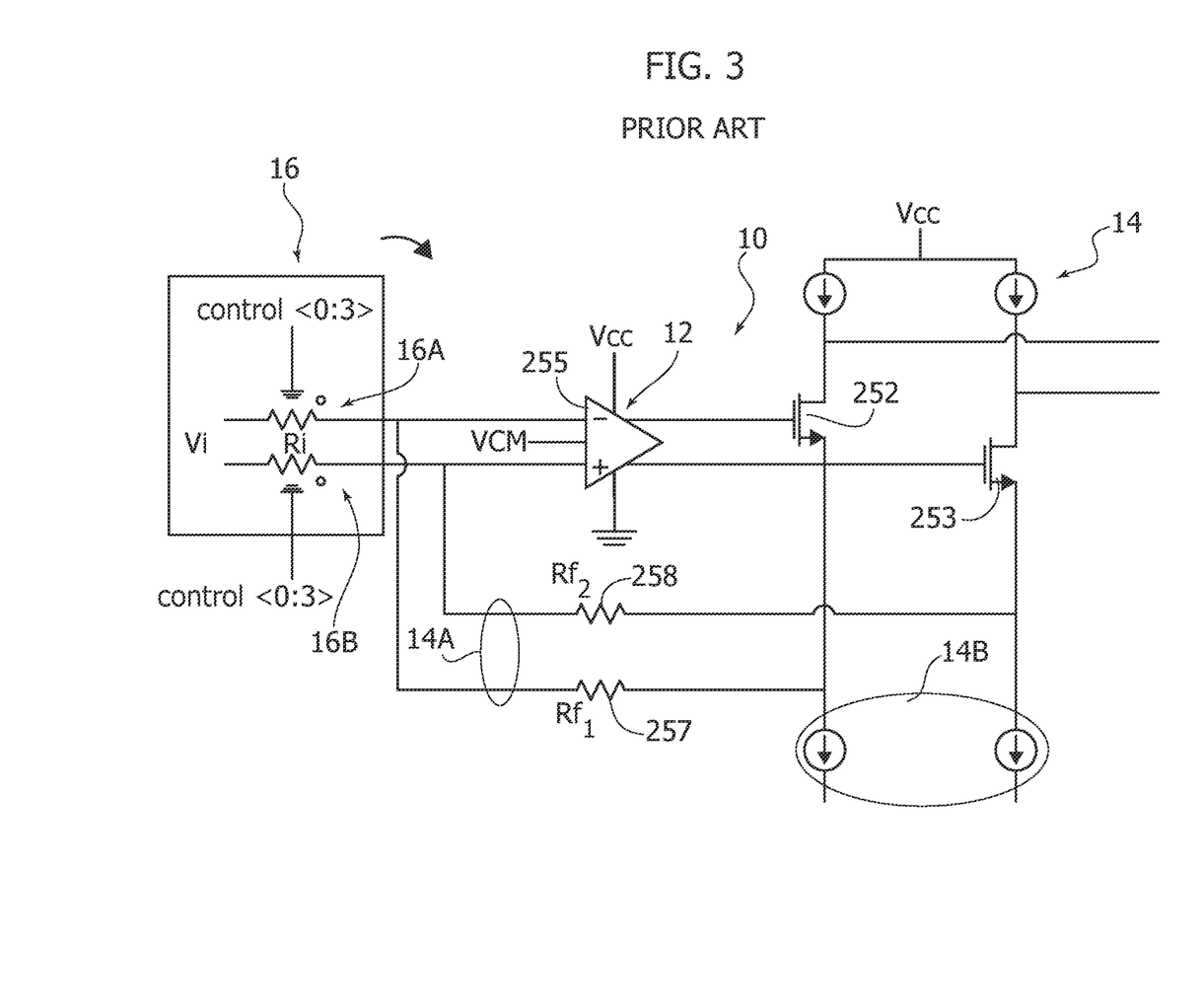
FIG. 3 is another circuit diagram of a conventional differential voltage-current (V/I) converter.

Reference to the possible (non-mandatory) use in combination with a sinewave voltage generator is otherwise helpful in discussing, in connection with FIGS. 2 and 3, certain drawbacks which may affect conventional V-I converters.

For instance, FIG. 2 is a circuit diagram of a voltage-current (V/I) converter, including a differential input stage 12 which receives at a first input (non-inverting, for instance) a voltage signal Vin from a voltage generator 200.

The output from the differential input stage 12 is used to drive a current mirror 14 supplied at a supply voltage VDD and including two branches, wherein:

a first branch 14A is returned to the second (inverting, for instance) input of the differential input stage 12, which is also coupled to ground GND via a resistor R, a second branch 14B is coupled to a load L (illustrated as a RLC network comprising resistive, inductive and capacitive components) to inject therein, due to the current mirror effect, an output current IOUT=VIn/R.

In a case as exemplified in FIG. 1, the voltage generator 200 may be a sinewave current generator operating at a (very) high clock (sampling) frequency (Fs) and its output is processed by the V-I converter to provide a (differential) sinusoidal current flowing between the output nodes OUT+, OUT− to drive a sinusoidal current on an external coil (antenna) L.

The voltage across the antenna will have different values as function of the antenna impedance at the frequency of the current provided. Reading that voltage facilitates understanding if the impedance of the antenna has changed.

This kind of operation may be helpful in a variety of applications, such as wireless chargers, for instance.

The main challenges to consider in such an application include:

a (very) high frequency signal may be involved, with the sinewave voltage generator 200 clocked at Fs>100 MHz, that is with a signal frequency (much) higher than 10 MHz, so that circuits having a bandwidth largely in excess of 10 MHz may be advantageous;

obtaining a (very) pure sinusoidal tone is desirable, which involves a low-distortion architecture: a pure sinusoidal signal facilitates revealing if the impedance of the load L has changed in a certain frequency range where the coil shows a peak resonance;

the ability of varying the amplitude of the output sinewave current, by changing the gain of the V-I converter is an appreciated feature.

It is noted that a (fully) differential architecture which does not introduce appreciable distortion at high frequencies may be beneficial in addressing the issues discussed above.

Such a differential architecture facilitates reducing substrate noise and coupling noise from other high-frequency switching circuits which may be included in a device as illustrated in FIG. 1 (as an application specific integrated circuit or ASIC, for instance).

Further, thanks to its natural symmetry, such a differential architecture may be an advantageous option in order to achieve low signal distortion.

Also, a differential architecture for a V-I converter is ideally suited to be coupled with a sinewave voltage generator in turn implemented as a differential circuit and also facilitates obtaining a high input impedance (hi-Z) for the V-I converter.

This in turn makes it easier to design an output stage for a sinewave voltage generator with area and power consumption savings.

A voltage-current (V/I) converter according to the circuit diagram of FIG. 2 may indeed provide a hi-Z input. This is however within the framework of a single-ended structure, which is far from satisfactory under various other respects as discussed in the foregoing.

Just to mention one point, if the voltage generator 200 arranged "upstream" the V-I converter 10 is of a differential type, any circuitry provided between the voltage generator 200 and the V-I converter 10 will need to convert the fully differential voltage output of the sinewave generator into a single ended signal.

FIG. 3 illustrates another conventional solution as disclosed in US2013/0234685 A1.

In FIG. 3 herein the original reference numbers of US2013/0234685 A1 are reproduced along with reference numbers corresponding to those in FIG. 2 herein. This is intended to highlight the presence in FIG. 3 of like parts or elements such as a differential input stage 12 and current mirror 14, having a first (differential) branch 14A returned to the input of the differential input stage 12 and a second (differential) branch 14B coupled to a load (not visible in FIG. 3).

The differential architecture of FIG. 3 also comprises an input gain-control stage 16 which is hardly compatible with a desired output impedance of a sinewave voltage generator arranged "upstream". This may be the case, for instance, if the two resistors 16A, 16B in the input gain-control stage 16 have a resistance value of the order of 1 KOhm in order to provide an output current as specified for the respective circuit.

Figure 4:
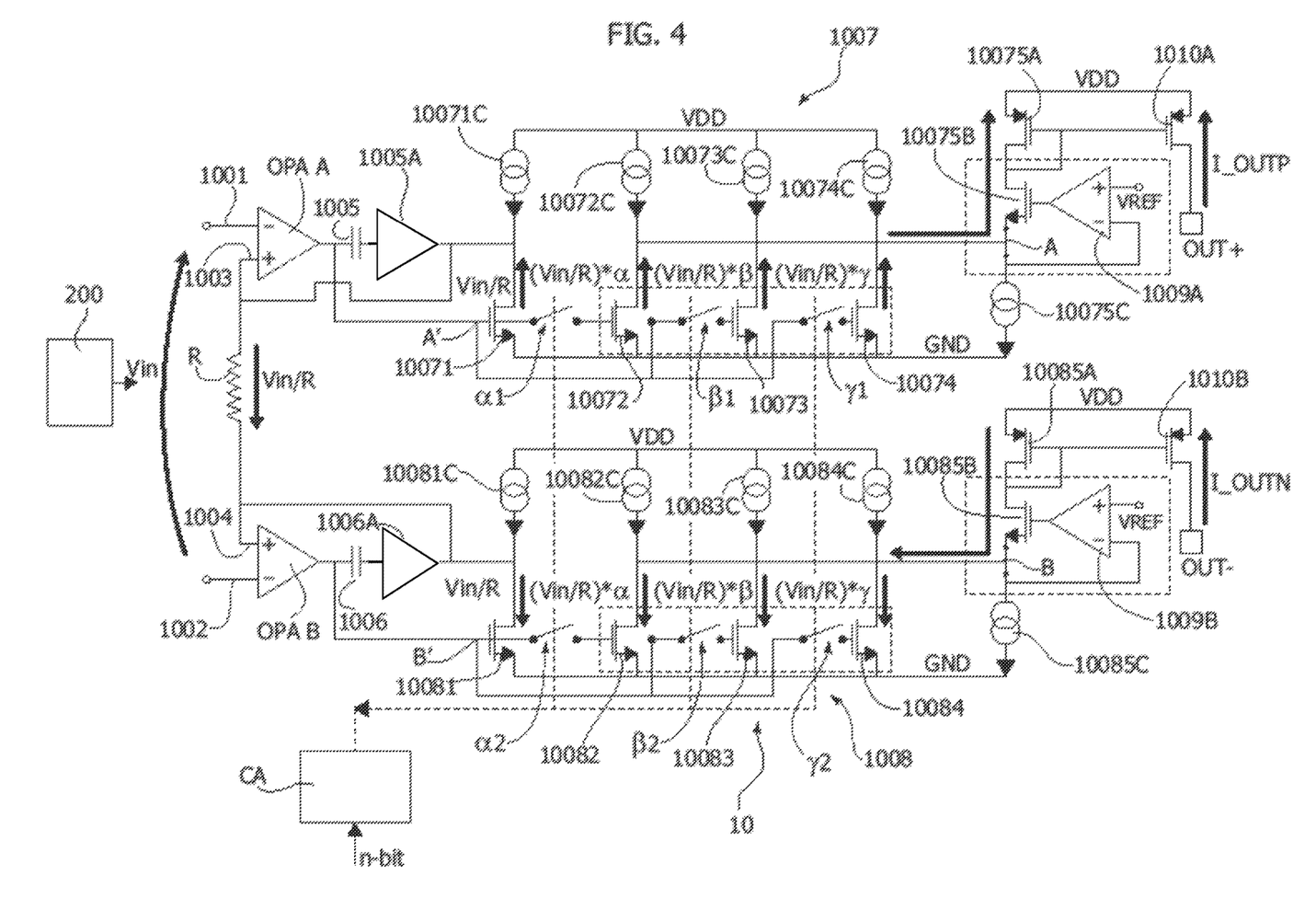
FIG. 4 is a circuit diagram exemplary of embodiments of the present description.

FIG. 4 is a circuit diagram exemplary of embodiments of a voltage-current (V-I) converter 10 as per the present description.

As illustrated, the voltage-current (V-I) converter 10 of FIG. 4 comprise an input stage including two differential circuits (operational amplifiers or op-amps, for instance) designated OP A and OPA B having respective first input nodes 1001, 1002 (of a homologous type, both "−", for instance) configured to have applied therebetween a (differential) input voltage Vin as provided, for instance, by a sinewave voltage generator 200 as discussed in the foregoing.

As illustrated, the two differential circuits OP A and OPA B have respective second input nodes 1003, 1004 (of a homologous type, both "+", for instance) mutually coupled via a resistor R.

As used herein, "homologous" is intended to designate parts or elements having the same relation, relative position, or structure. For instance the input nodes 1001, 1002 and 1003, 1004 are referred to as of an homologous type insofar as they are both "−" or both "+".

Thanks to the presence of the differential circuits OP A and OPA B (in the following referred to simply as op-amps OPA A and OPA B, for brevity) the first input nodes 1001, 1002 will provide a hi-Z (differential) input port to the converter 10 for the voltage Vin, while a current of intensity Vin/R flows between the second input nodes 1003, 1004.

As illustrated, the outputs from the opamps OPA A and OPA B are coupled via capacitors 1005 and 1006 to the respective (non-inverting) input nodes 1003 and 1004 to provide respective RC feedback networks for the opamps OPA A and OPA B. As exemplified in FIG. 4, this may occur with (compensation) buffer stages 1005A and 1006A coupled (in series) with the capacitors 1005 and 1006. This was found to be advantageous in countering undesired harmonic distortion at the (high) frequencies possibly involved as discussed in the introductory portion of the description.

As exemplified in FIG. 4, the outputs from the opamps OPA A and OPA B are coupled to respective input nodes A' and B' in two current mirror circuits 1007, 1008 having output nodes A and B.

As exemplified herein, the current mirror circuits 1007, 1008 are multi-stage circuits comprising:

a set of input transistors 10071, 10072, 10073, 10074 (mirror circuit 1007) and 10081, 10082, 10083, 10084 (mirror circuit 1008), respective output transistor pairs 10075A, 10075B (mirror circuit 1007) and 10085A, 10085B (mirror circuit 1008).

As exemplified herein, the transistors in question are field-effect transistors such as MOSFET transistors having respective current paths (here, source-drain) therethrough with the current flow therein controlled as a function of signals applied to a respective control terminal (here, gate).

As exemplified herein, the flow paths through the transistors 10071, 10072, 10073, 10074 and 10081, 10082, 10083, 10084 are coupled (at the drains, for instance) to respective current generators (these are indicated with the same reference numerals of the respective transistors followed by the suffix "C") of any known type to those of skilled in the art with the nodes A' and B' coupled to the current paths through the transistors 10071 and 10081 and the current generators 10071C and 10081C.

As exemplified in FIG. 4:

a first output node A from the mirror circuit 1007 is coupled to the (mutually shorted) current paths through the transistors 10072, 10073, 10074 at the current generators 10072C, 10073C, 10074C;

a second output node B from the mirror circuit 1008 is coupled to the (mutually shorted) current paths through the transistors 10082, 10083, 10084 at the current generators 10082C, 10083C, 10084C.

As exemplified in FIG. 4, the output signals of the op-amps OPA A and OPA B are applied at input nodes A' and B' of the current mirror circuits 1007, 1008 provided by the control terminal (here, gates) of the (first) transistors 10071, 10081 so that a current of intensity Vin/R will flow through the (source-drain) current flow paths through the transistors 10071, 10081.

Finally, as illustrated in FIG. 4, the (source-drain) current flow paths through the transistors 10071, 10072, 10073, 10074 (mirror circuit 1007) and 10081, 10082, 10083, 10084 (mirror circuit 1008) are referred to ground GND (on the side opposite the associated current generators, that is at their sources in the exemplary case considered herein) to which the points A and B are similarly referred via current generators 10075C and 10085C associated with the transistor pairs 10075A, 10075B and 10085A, 10085B.

It will be otherwise assumed that (according to an advantageous option) the mirror circuits 1007, 1008 are symmetrical, with the transistors 10071, 10072, 10073, 10074 in the mirror circuit 1007 identical to the transistors 10081, 10082, 10083, 10084 in the mirror circuit 1008, respectively.

As exemplified in FIG. 4, in one or more embodiments, switches $\alpha 1$, $\beta 1$, $\gamma 1$ and $\alpha 2$, $\beta 2$, $\gamma 2$ (electronic switches such as transistors, for instance) may be provided configured to couple (during an "on" state, that is, when conductive) the control electrodes (gates) of the transistors 10072, 10073 and 10074 (mirror circuit 1007) and the transistors 10082, 10083, 10084 (mirror circuit 1008) with the nodes A' and B' (in the case of the switches $\alpha 1$ and $\alpha 2$ this is exemplified to occur via the control electrodes of the transistors 10071 and 10081).

In that way, the left-hand side of the mirror circuits 1007 and 1008 can be caused to include a plurality of transistors arranged in parallel with the transistors involved in such arrangement selectable as a function of those of the switches $\alpha 1$, $\beta 1$, $\gamma 1$ and $\alpha 2$, $\beta 2$, $\gamma 2$ that are switched to the "on", conductive state.

This may occur as function of a logical amplitude control signal AC (n-bit, with n equal to 3 in the exemplary case considered herein where three switches $\alpha 1$, $\beta 1$, $\gamma 1$ and $\alpha 2$, $\beta 2$, $\gamma 2$ are present in the mirror circuits 1007 and 1008) provided by an amplitude control circuit CA, which may be a distinct element from the embodiments.

Selectively operating the switches $\alpha 1$, $\beta 1$, $\gamma 1$ and $\alpha 2$, $\beta 2$, $\gamma 2$—along with possible different areas for the transistors 10071, 10072, 10073 and 10074 (mirror circuit 1007) and 10081, 10082, 10083, 10084 (mirror circuit 1008)—may facilitate selectively setting the value of the gain factor of the mirror circuits 1007 and 1008 to different values as a function of (Vin/Rin)*$\alpha$, (Vin/Rin)*$\beta$ and (Vin/Rin)*$\gamma$ thereby changing the amplitude of the output current at I_OUTP and I_OUTN as desired.

For instance, assuming for simplicity that (out of the switches $\alpha 1$, $\beta 1$, $\gamma 1$ and $\alpha 2$, $\beta 2$, $\gamma 2$ discussed in the foregoing), the switches $\alpha 1$ and $\alpha 2$ are in an "on" or conductive state while the switches $\beta 1$, $\gamma 1$ and $\beta 2$, $\gamma 2$ are in an "off" or non-conductive state), a current Vin/R*$\alpha$, with $\alpha$ being a gain factor which can be set (determined) via the characteristics of the transistors 10071, 10072 and 10081, 10082, will be mirrored at the nodes A and B, with the capability of being sensed (read) between these nodes.

Similarly, assuming then that the switches $\alpha 1$ and $\beta 1$ (on the one part) and the switches $\alpha 2$ and $\beta 2$ (on the other part) are in an "on" or conductive state while the switches $\gamma 1$ and $\gamma 2$ are an "off" or non-conductive state), a current Vin/R*$\alpha$+Vin/R*$\beta$ (with $\beta$ being a gain factor which can be set (determined) via the characteristics of the transistors 10073 and 10083 (in combination with 10071, 10072 and 10081, 10082) will be mirrored at the nodes A and B, again with the capability of being sensed (read) between these nodes.

Also, assuming then that all the switches $\alpha 1$, $\beta 1$ and $\gamma 1$ and the switches $\alpha 2$, $\beta 2$ and $\gamma 2$ are in an "on" or conductive state, a current Vin/R*$\alpha$+Vin/R*$\beta$+Vin/R*$\gamma$ (with $\gamma$ being a gain factor which can be set (determined) via the characteristics of the transistors 10074 and 10084 (in combination with 10071, 10072, 10073 and 10081, 10082, 10083) will be mirrored at the nodes A and B, again with the capability of being sensed (read) between these nodes.

As exemplified in FIG. 4, such a sensing action may occur through a (very) low impedance sensing circuit comprising differential circuits such as op-amps 1009A, 1009B having:

first homologous inputs (inverting inputs, for instance) coupled to node A and node B, second homologous inputs (non-inverting inputs, for instance) configured to receive a reference voltage VREF, respective outputs coupled to the control terminals (gate, in the case of field effect transistor such as MOSFET transistors as illustrated) of the transistors 10075B, 10085B in of the pairs 10075A, 10075B and 10085A, 10085B.

As exemplified in FIG. 4, the transistors 10075A, 10085A in the pairs 10075A, 10075B and 10085A, 10085B are in a diode-like configuration with their control terminals (gates, in the case of field effect transistor such as MOSFET transistors as illustrated) shorted (at the drain for instance) to the current path therethrough and coupled to the control terminals (gates, in the case of field effect transistor such as MOSFET transistors as illustrated) of output transistors 1010A and 1010B. The output transistors 1010A and 1010B mirror at the current paths therethrough (here, source-drain) the current at node A and B as an output current I_OUTP and I_OUTN at the output pads OUT+ and OUT− configured to be coupled to an external load L (an antenna coil, for instance, not visible in FIG. 4: see FIG. 1 for reference).

The architecture exemplified in FIG. 4 lends itself to being implemented and operated in a highly symmetrical manner (OPA A=OPA B; 1005=1006; 1007=1008; α1=α2, β2, β1=β2, γ1=γ2 and so on) in terms of transistors (that is with the transistors 10071, 10072, 10073, 10074 in the mirror circuit 1007 identical to the transistors 10081, 10082, 10083, 10084 in the mirror circuit 1008, respectively) and circuits; such symmetry facilitates achieving (very) low harmonic distortion.

One or more embodiments were found to provide a (fully) differential V-I converter with hi-Z impedance input and to facilitate a reduction of substrate and coupling noise from high-frequency circuits in a same device.

One or more embodiments were also found to reduce signal distortion and to facilitate generating a pure sinusoidal tone with high SFDR.

A voltage-current converter circuit (for instance, 10) as exemplified herein may comprise:

a first (for instance, OPA A) and a second (for instance, OPA B) (differential) amplifier, having homologous (for instance, both inverting) first input nodes (for instance, 1001, 1002) configured to receive a voltage signal (for instance, Vin) therebetween as well as homologous (for instance, both non-inverting) second input nodes (for instance, 1003, 1004) having a resistor (for instance, R) coupled therebetween, the first amplifier having a first output node (for instance, A') and the second amplifier having a second output node (for instance, B'), first current mirror circuitry (for instance, 1007) comprising a first input transistor (for instance, 10071) having a control terminal coupled to the first output node of the first amplifier (OPA A), the first current mirror circuitry comprising a first current mirror output node (for instance, A), second current mirror circuitry (for instance, 1008) comprising a second input transistor (for instance, 10081) having a control terminal coupled to the second output node of the second amplifier, the second current mirror circuitry comprising a second current mirror output node (for instance, B), first (for instance, 10075A, 10075B, 1009A, 1010A) and second (for instance, 10085A, 10085B, 1009B, 1010B) current sensing circuitry having first (for instance, OUT+) and second (for instance, OUT−) current output nodes, the first and the second current sensing circuitry coupled to the first current mirror output node and the second current mirror output node, respectively, the first and second current output nodes configured to provide therebetween a current (for instance, I_OUTP, I_OUTN) which is a function of the voltage signal (for instance, Vin) between the homologous first input nodes of the first and the second amplifiers.

In a circuit as exemplified herein, the homologous first input nodes and the homologous second input nodes may be inverting and non-inverting inputs, respectively, to the first and the second amplifier.

In a circuit as exemplified herein, the first and second amplifiers comprise differential amplifiers having respective capacitive feedback lines (for instance, 1005, 1005A and 1006, 1006A) from the first output node (for instance, A') and the second output node (for instance, B') to the second input nodes (for instance, 1003, 1004).

In a circuit as exemplified herein:

the first current mirror output node may be located in the current flow path through at least one output transistor (for instance, 10075B) in the first current mirror circuitry, the second current mirror output node may be is located in the current flow path through at least one output transistor (for instance, 10085B) in the second current mirror circuitry, the first and second current sensing circuitry may comprise respective buffer differential circuits (for instance, 1009A, 1009B) sensitive to the difference to a reference voltage (for instance, VREF) of the voltage at the first current mirror output node and the second current mirror output node, the respective buffer differential circuits coupled to control terminals of the at least one output transistor in the first current mirror circuitry and the at least one output transistor in the second current mirror circuitry.

In a circuit as exemplified herein, the first and the second current sensing circuitry may comprise respective current mirror circuits (for instance, 10075A, 1010A; 10085A, 1010B) to mirror at the first and the second current output nodes the current at the first current mirror output node and the second current mirror output node.

In a circuit as exemplified herein:

the first current mirror circuitry may comprise at least one first supplemental input transistor (for instance, 10072, 10073, 10074) activatable (for instance, via the switches α1, β1, γ1) in combination with the first input transistor to vary the current mirror factor of the first current mirror circuitry (1007)

the second current mirror circuitry may comprise at least one second supplemental input transistors (for instance, 10082, 10083, 10084) activatable (for instance, α2, β2, γ2) in combination with the second input transistor to vary the current mirror factor of the second current mirror circuitry (optionally in the same manner of the current mirror factor of the first current mirror circuitry).

In a circuit as exemplified herein:

the first current mirror circuitry may comprise a plurality of first supplemental input transistor selectively activatable in combination with the first input transistor to vary the current mirror factor of the first current mirror circuitry, the second current mirror circuitry may comprise a plurality of second supplemental input transistors activatable in combination with the second input transistor to vary the current mirror factor of the second current mirror circuitry (optionally in the same manner of the current mirror factor of the first current mirror circuitry).

In a circuit as exemplified herein:

the first current mirror circuitry and the second current mirror circuitry may comprise homologous first and second supplemental input transistors activatable in combination with the first input transistor and the second input transistor via respective activation switches (for instance, α1, β1, γ1; α2, β2, γ2), a control line (for instance, AC) is provided coupled to the respective activation switches and configured to activate the homologous first and second supplemental input transistors to vary in a same amount (for instance, α, β, γ) the current mirror factors in the first current mirror circuitry and the second current mirror circuitry.

A device as exemplified herein (for instance, 100) may comprise:
a source (for instance, 200) of a voltage signal (for instance, Vin),
a circuit (for instance, 10) as exemplified herein coupled to the source of a voltage signal to receive the voltage signal applied differentially between the homologous first input nodes, wherein a current-converted replica of the voltage signal is available between the first and second current output nodes.

A method of producing a current signal as exemplified herein may comprise:
applying a voltage signal (differentially) between the homologous first input nodes in a circuit as exemplified herein,
collecting a current-converted replica of the voltage signal between the first and second current output nodes in a circuit as exemplified herein.

Without prejudice to the underlying principles, the details and embodiments may vary, even significantly, with respect to what has been described by way of example only without departing from the extent of protection.

The extent of protection is determined by the annexed claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
first and second amplifiers, comprising homologous first input nodes configured to receive a voltage signal therebetween, and comprising homologous second input nodes having a resistor coupled therebetween, wherein the first amplifier comprises a first output node and wherein the second amplifier comprises a second output node;
first current mirror circuitry comprising a first input transistor having a first control terminal coupled to the first output node of the first amplifier, wherein the first current mirror circuitry comprises a first current mirror output node;
second current mirror circuitry comprising a second input transistor having a second control terminal coupled to the second output node of the second amplifier, wherein the second current mirror circuitry comprises a second current mirror output node; and
first and second current sensing circuitry having first and second current output nodes, wherein the first and the second current sensing circuitry is coupled to the first current mirror output node and to the second current mirror output node, respectively, wherein the first and second current output nodes are configured to provide therebetween a current that is a function of the voltage signal between the homologous first input nodes of the first and the second amplifiers.

2. The circuit of claim 1, wherein the homologous first input nodes and the homologous second input nodes are inverting and non-inverting inputs, respectively, to the first and second amplifiers.

3. The circuit of claim 1, wherein the first and the second amplifiers comprise differential amplifiers having respective capacitive feedback lines from the first output node and the second output node to the homologous second input nodes.

4. The circuit of claim 1, wherein:
the first current mirror output node is located in a first current flow path through at least one first output transistor in the first current mirror circuitry;
the second current mirror output node is located in a second current flow path through at least one second output transistor in the second current mirror circuitry; and
the first and the second current sensing circuitry comprise respective buffer differential circuits sensitive to a difference between a reference voltage and a first voltage at the first current mirror output node and a difference between the reference voltage and a second voltage at the second current mirror output node, respectively, wherein the respective buffer differential circuits are coupled to control terminals of the at least one first output transistor in the first current mirror circuitry and the at least one second output transistor in the second current mirror circuitry.

5. The circuit of claim 4, wherein the first and the second current sensing circuitry comprise respective current mirror circuits to mirror, respectively, a first current at the first current mirror output node and a second current the second current mirror output node.

6. The circuit of claim 1, wherein:
the first current mirror circuitry comprises at least one first supplemental input transistor activatable in combination with the first input transistor to vary a first current mirror factor of the first current mirror circuitry; and
the second current mirror circuitry comprises at least one second supplemental input transistor activatable in combination with the second input transistor to vary a second current mirror factor of the second current mirror circuitry.

7. The circuit of claim 6, wherein:
the first current mirror circuitry comprises a plurality of first supplemental input transistors selectively activatable in combination with the first input transistor to vary the first current mirror factor of the first current mirror circuitry; and
the second current mirror circuitry comprises a plurality of second supplemental input transistors activatable in combination with the second input transistor to vary the second current mirror factor of the second current mirror circuitry.

8. The circuit of claim 6, wherein:
the first current mirror circuitry and the second current mirror circuitry comprise homologous first and second supplemental input transistors activatable in combination with the first input transistor and the second input transistor via respective activation switches; and
the circuit further comprises a control line coupled to the respective activation switches, wherein the control line is configured to activate the homologous first and second supplemental input transistors to vary in a same amount the first and second current mirror factors in the first and second current mirror circuitry, respectively.

9. A device, comprising:
a circuit, comprising:
first and second amplifiers, comprising homologous first input nodes configured to receive a voltage signal therebetween, and comprising homologous second input nodes having a resistor coupled therebetween, wherein the first amplifier comprises a first output node and wherein the second amplifier comprises a second output node;

first current mirror circuitry comprising a first input transistor having a first control terminal coupled to the first output node of the first amplifier, wherein the first current mirror circuitry comprises a first current mirror output node;

second current mirror circuitry comprising a second input transistor having a second control terminal coupled to the second output node of the second amplifier, wherein the second current mirror circuitry comprises a second current mirror output node; and first and second current sensing circuitry having first and second current output nodes, wherein the first and the second current sensing circuitry is coupled to the first current mirror output node and to the second current mirror output node, respectively, wherein the first and second current output nodes are configured to provide therebetween a current that is a function of the voltage signal between the homologous first input nodes of the first and the second amplifiers; and a source of the voltage signal coupled to the circuit and configured to apply the voltage signal differentially between the homologous first input nodes, wherein a current-converted replica of the voltage signal is available between the first and second current output nodes.

10. The device of claim 9, wherein the homologous first input nodes and the homologous second input nodes are inverting and non-inverting inputs, respectively, to the first and second amplifiers.

11. The device of claim 9, wherein the first and the second amplifiers comprise differential amplifiers having respective capacitive feedback lines from the first output node and the second output node to the homologous second input nodes.

12. The device of claim 9, wherein:
the first current mirror output node is located in a first current flow path through at least one first output transistor in the first current mirror circuitry;
the second current mirror output node is located in a second current flow path through at least one second output transistor in the second current mirror circuitry; and
the first and the second current sensing circuitry comprise respective buffer differential circuits sensitive to a difference between a reference voltage and a first voltage at the first current mirror output node and a difference between the reference voltage and a second voltage at the second current mirror output node, respectively, wherein the respective buffer differential circuits are coupled to control terminals of the at least one first output transistor in the first current mirror circuitry and the at least one second output transistor in the second current mirror circuitry.

13. The device of claim 12, wherein the first and the second current sensing circuitry comprise respective current mirror circuits to mirror, at the first and the second current output nodes, a first current at the first current mirror output node and a second current the second current mirror output node.

14. The device of claim 9, wherein:
the first current mirror circuitry comprises at least one first supplemental input transistor activatable in combination with the first input transistor to vary a first current mirror factor of the first current mirror circuitry; and
the second current mirror circuitry comprises at least one second supplemental input transistor activatable in combination with the second input transistor to vary a second current mirror factor of the second current mirror circuitry.

15. The device of claim 14, wherein:
the first current mirror circuitry comprises a plurality of first supplemental input transistors selectively activatable in combination with the first input transistor to vary the first current mirror factor of the first current mirror circuitry; and
the second current mirror circuitry comprises a plurality of second supplemental input transistors activatable in combination with the second input transistor to vary the second current mirror factor of the second current mirror circuitry.

16. The device of claim 14, wherein:
the first current mirror circuitry and the second current mirror circuitry comprise homologous first and second supplemental input transistors activatable in combination with the first input transistor and the second input transistor via respective activation switches; and
the circuit further comprises a control line coupled to the respective activation switches, wherein the control line is configured to activate the homologous first and second supplemental input transistors to vary in a same amount the first and second current mirror factors in the first and second current mirror circuitry, respectively.

17. A method of producing a current signal, the method comprising:
applying a voltage signal differentially between homologous first input nodes in a circuit, the circuit comprising:
first and second amplifiers, comprising the homologous first input nodes configured to receive the voltage signal therebetween, and comprising homologous second input nodes having a resistor coupled therebetween, wherein the first amplifier comprises a first output node and wherein the second amplifier comprises a second output node;
first current mirror circuitry comprising a first input transistor having a first control terminal coupled to the first output node of the first amplifier, wherein the first current mirror circuitry comprises a first current mirror output node;
second current mirror circuitry comprising a second input transistor having a second control terminal coupled to the second output node of the second amplifier, wherein the second current mirror circuitry comprises a second current mirror output node; and
first and second current sensing circuitry having first and second current output nodes, wherein the first and the second current sensing circuitry is coupled to the first current mirror output node and to the second current mirror output node, respectively, wherein the first and second current output nodes are configured to provide therebetween a current that is a function of the voltage signal between the homologous first input nodes of the first and the second amplifiers; and
collecting a current-converted replica of the voltage signal between the first and second current output nodes in the circuit.

18. The method of claim 17, further comprising:
providing, by the homologous first input nodes, inverting inputs to the first and second amplifiers; and
providing, by the homologous second input nodes, non-inverting inputs to the first and second amplifiers.

19. The method of claim 17, further comprising:
feeding back, via a first capacitive feedback line, the first output node to the second input node of the first amplifier, the first amplifier being a first differential amplifier; and
feeding back, via a second capacitive feedback line, the second output node to the second input node of the second amplifier, the second amplifier being a second differential amplifier.

20. The method of claim 17, further comprising:
mirroring, by a first current mirror circuit in the first current sensing circuitry, a first current at the first current mirror output node; and
mirroring, by a second current mirror circuit in the second current sensing circuitry, a second current at the second current mirror output node.

\* \* \* \* \*